United States Patent [19]
Takikawa

[11] Patent Number: 5,945,695
[45] Date of Patent: Aug. 31, 1999

[54] SEMICONDUCTOR DEVICE WITH INGAP CHANNEL LAYER

[75] Inventor: Masahiko Takikawa, Kawasaki, Japan

[73] Assignee: Fujitsu Limited, Kanagawa, Japan

[21] Appl. No.: 08/929,252

[22] Filed: Sep. 15, 1997

[30] Foreign Application Priority Data

Mar. 19, 1997 [JP] Japan ..................................... 9-065673

[51] Int. Cl.$^6$ ................. H01L 31/0328; H01L 31/0336; H01L 31/072; H01L 31/109

[52] U.S. Cl. ........................... 257/192; 257/201; 257/280

[58] Field of Search .................................... 257/192, 201, 257/280

[56] References Cited

U.S. PATENT DOCUMENTS

| | | | |
|---|---|---|---|
| 5,448,086 | 9/1995 | Hida .......................................... | 257/194 |
| 5,504,353 | 4/1996 | Kuzuhara ................................. | 257/194 |
| 5,682,040 | 10/1997 | Imanishi .................................... | 257/12 |
| 5,698,868 | 12/1997 | Awano et al. ......................... | 257/192 X |
| 5,751,028 | 5/1998 | Kikkawa ................................. | 257/192 |
| 5,760,427 | 6/1998 | Onda ........................................ | 257/194 |

FOREIGN PATENT DOCUMENTS 6-232181   6/1994   Japan .

OTHER PUBLICATIONS

"High Breakdown–Voltage $Ga_{0.51}In_{0.49}P$ Channel MESFET's Grown by GSMBE", Yo–Sheng Lin and Shey–Shi Lu; IEE Electron Device Letters, vol. 17, No. 9, Sep. 1996.

*Primary Examiner*—William Mintel
*Attorney, Agent, or Firm*—Armstrong, Westerman, Hattori, McLeland & Naughton

[57] ABSTRACT

A semiconductor device comprises a GaAs substrate 10; a buffer layer 12 formed on the GaAs substrate 10 and having a wider band gap than that of InGaP; a channel layer 14 formed on the buffer layer 12 and formed of an InGaP; a gate electrode 34 for controlling current of the channel layer 14. InGaP has a high carrier mobility and large Γ-L energy difference. Accordingly, the channel layer is formed of InGaP, whereby the semiconductor device which is operable at high speed and high voltage can be obtained.

11 Claims, 4 Drawing Sheets

SEMICONDUCTOR DEVICE WITH INGAP CHANNEL LAYER

BACKGROUND OF THE INVENTION

The present invention relates to a semiconductor device having high speed and high-power output, and a method for fabricating the same.

In the field of mobile communication systems, used frequencies thereof have recently increased to around 2 GHz, and electronic devices having high speeds and high-power outputs constituting such systems are required. In the technical field of semiconductor devices, various studies are made for higher voltage resistances of field effect transistors.

The field effect transistor conventionally includes the channel region of Si or GaAs.

The field effect transistor including the channel region of Si is exemplified by a metal-oxide-semiconductor field effect transistor (MOSFET) formed on an Si substrate. The MOSFET including the channel region of Si, which is an indirect transition-type semiconductor, does not have Gunn oscillation even at high operational voltages. Accordingly the gate electrode and the drain electrode are allowed to be spaced from each other by a large gap, whereby high operational voltages can be easily obtained. However, because of Si, whose carrier mobility is low, it is difficult to use the MOS field effect transistor in the above-described application requiring high speed operation.

The field effect transistor including the channel region of GaAs is exemplified by a metal-semiconductor field effect transistor (MESFET) formed on a GaAs substrate. Because of GaAs, which has a higher carrier mobility than Si, the field effect transistor including the channel region of GaAs is more suitable for high speed operation, but because of GaAs, which is a direct transition-type semiconductor and has a low Γ-L energy difference as low as about 0.2 eV, often fails to normally operate because of Gunn oscillation due to operational voltage increase. This inconvenience must be removed by gate width increase for higher power output. However, this leads to chip area increase and cost increase, and is limited in terms of handling. Presently, in consideration of suppressing the Gunn oscillation, 10 V operation is a limit, and an about 1×3 mm chip size is a limit in consideration of handling. In consideration of output, an about 30–40 W is a limit.

Recently pseudo morphic structure, which includes an InGaAs film of an In composition which does not permit dislocations formed on a GaAs substrate, sandwiched by GaAs is locally practiced. The pseudo morphic structure, whose Γ-L energy difference is larger than GaAs, can enhance the effect of suppressing the Gunn oscillations. However, in the pseudo morphic structure, whose band gap is smaller, impact ionization tends to take place in the channel region, and holes are accumulated. As a result, a kink often takes place in the I–V characteristics. Thus, the pseudo morphic structure cannot either attain higher power outputs by high voltage operation.

As described above, the conventional field effect transistor has found it difficult to provide high-power outputs by high voltage operation.

SUMMARY OF THE INVENTION

An object of the present invention is to provide a semiconductor device having a high-power output by high voltage operation, and a method for fabricating the same.

The above-described object is achieved by a semiconductor device comprising: a GaAs substrate; a buffer layer formed on the GaAs substrate and formed of a semiconductor material having a wider band gap than InGaP; a channel layer formed of an InGaP formed on the buffer layer; and a gate electrode for controlling current of the channel layer. The semiconductor device which is operative at high voltage and has high-power output can be obtained.

In the above-described semiconductor device it is preferable that an In composition ratio of the InGaP forming the channel layer is not less than 0.3 and not more than 0.7. This In composition ratio allows the channel layer of an InGaP layer to be epitaxially grown on the buffer layer.

In the above-described semiconductor device it is preferable that the buffer layer is formed of an AlInGaP. By forming the buffer layer of an AlInGaP layer, channel current can be effectively confined in the channel layer.

In the above-described semiconductor device it is preferable that an Al composition ratio of the AlInGaP is more than 0, and a sum of the Al composition ratio and a Ga composition ratio is substantially equal to 0.51. An Al composition ratio is larger than 0, and a sum of the Al composition ratio and a Ga composition ratio is substantially 0.51, whereby the buffer layer having a wider band gap than the channel layer can be epitaxially grown on the GaAs substrate.

In the above-described semiconductor device it is preferable that the buffer layer is formed of an AlGaAs. The buffer layer is formed of an AlGaAs layer, whereby channel current can be effectively confined in the channel layer.

In the above-described semiconductor device it is preferable that an Al composition ratio of the AlGaAs layer is not less than 0.2. An Al composition ratio of the AlGaAs layer is above 0.2, whereby the buffer layer can have a wider band gap than the channel layer.

In the above-described semiconductor device it is preferable that a Schottky layer is formed on the channel layer and is formed of a semiconductor material containing no In. The channel layer of an InGaP layer is covered with the Schottky layer containing no In, whereby it is prevented that the In-content layer is oxidized and a conducting film (oxidized In-content layer) is formed on the surface. The semiconductor device can have higher reliability.

In the above-described semiconductor device it is preferable that the Schottky layer is formed of a GaAs or an AlGaAs. The Schottky layer can be formed of these films.

The above-described object is achieved by a method for fabricating a semiconductor device comprising the steps of: forming a buffer layer formed of a semiconductor material having a wider band gap than that of InGaP on the GaAs substrate; forming a channel layer formed of an InGaP on the buffer layer; and forming a gate electrode for controlling current of the channel layer. A semiconductor device which is operative at high voltage and has high-power output can be easily fabricated.

DETAILED DESCRIPTION OF THE INVENTION

The semiconductor device according to one embodiment of the present invention, and the method for fabricating the same will be explained.

Figure 1:
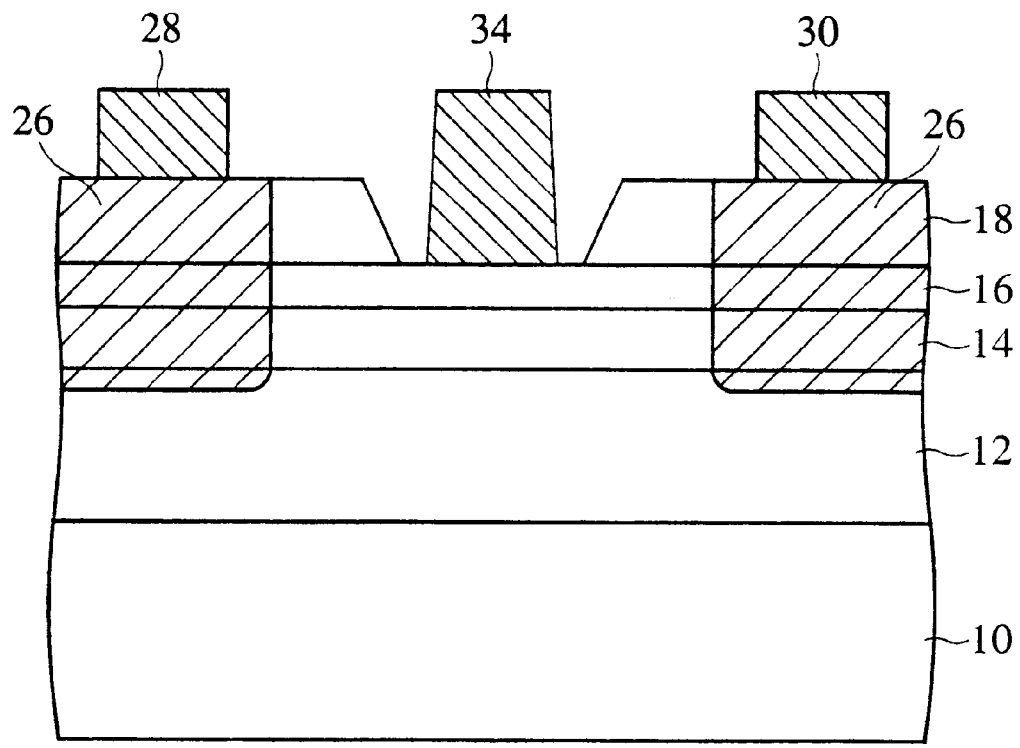
FIG. 1 is a diagrammatic sectional view of the semiconductor device according to the embodiment of the present invention, which shows a structure thereof.
Figure 2:
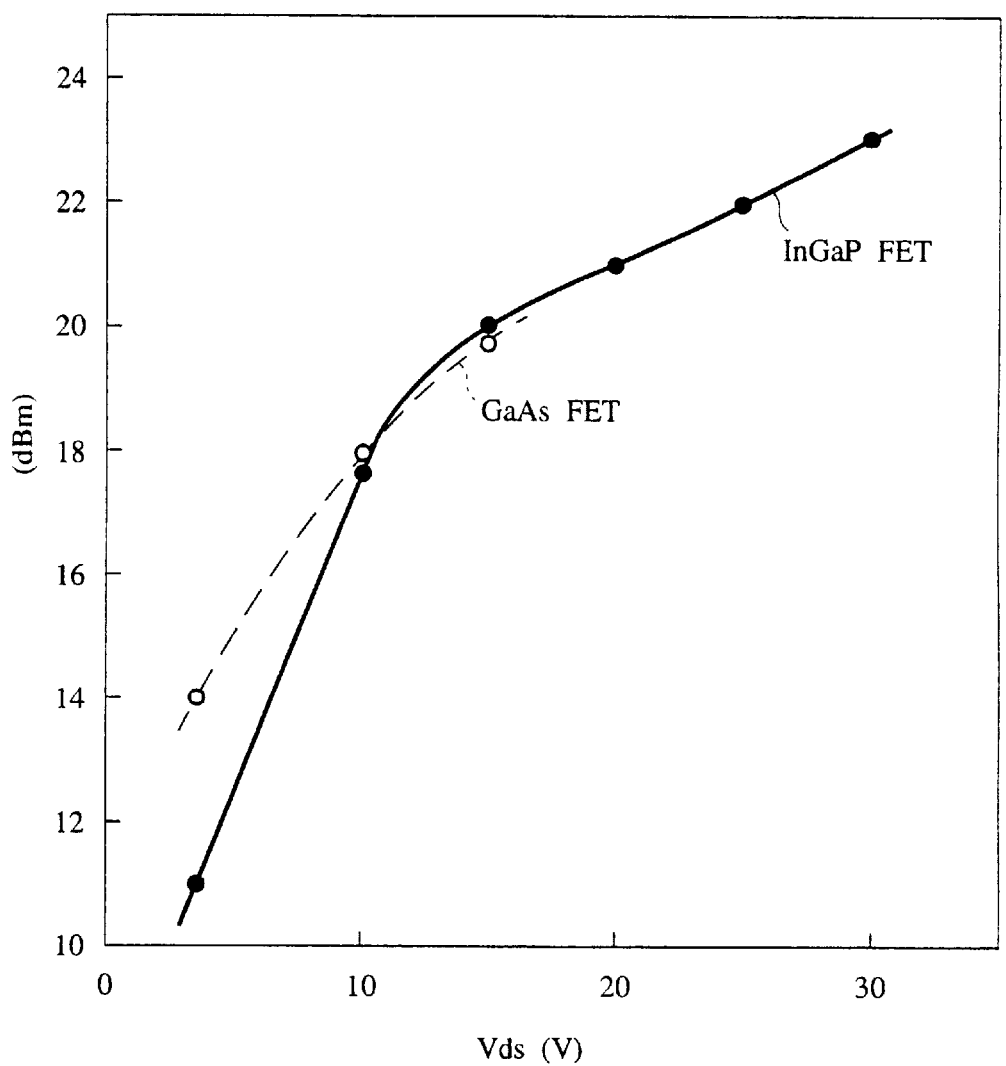
FIG. 2 is a graph of power characteristic dependence on drain voltage of the semiconductor device according to the embodiment of the present invention.

FIG. 1 is a diagrammatic sectional view of the semiconductor device according to the present embodiment, which shows a structure thereof. FIG. 2 is a graph of drain voltage dependence of power characteristics of the semiconductor device according to the present embodiment. FIGS. 3A–3C and 4A–4C are sectional views of the semiconductor device in the steps of the method for fabricating the same, which shows the method.

A buffer layer 12 of AlInP is formed on a GaAs substrate 10. A channel layer 14 of InGaP is formed on the buffer layer 12. A Schottky layer 16 of AlGaAs is formed on the channel layer 14. A cap layer 18 of GaAs is formed on the Schottky layer 16. A source electrode 28 and a drain electrode 30 of AuGe/Au structure is formed on the cap layer 18. A gate electrode 34 is formed on the Schottky layer 16 between the source electrode 28 and the drain electrode 30. An ohmic contact layer 26 is formed below the source electrode 28 and the drain electrode 30 down to the buffer layer 12.

The semiconductor device according to the present embodiment is characterized in that the channel layer 14 is formed of InGaP layer.

To enable a field effect transistor to operate at a high voltage it is preferable that a material having a large Γ-L energy difference is used to suppress Gunn oscillation, and a material having a wide band gap is used to suppress impact ionization.

Here, InGaP is a direct transition-type Group III–V semiconductor and has a carrier mobility as high as about 2000 [cm$^2$/V·sec]. A Γ-L energy difference of InGaP is about 0.4 V, which is higher than a 0.2 V Γ-L energy difference of GaAs. Furthermore, a band gap of InGaP is about 1.95 eV, which is wider than a 1.45 eV band gap of GaAs. Accordingly, the channel layer is formed of InGaP, whereby a field effect transistor which is operable at high speed and a high voltage can be obtained.

An In composition ratio of the InGaP is set at a range in which the InGaP layer can be epitaxially grown on the buffer layer 12. To be specific, an In composition ratio is set at a range of 0.3 to 0.7 to enable the epitaxial growth. An In composition ratio for perfect lattice matching with the GaAs is 0.51.

The composition ratio in the specification of the present application means a ratio of one element to a Group III element contained in a semiconductor material when the Group III element is 1. In the case of the above-described InGaP layer, for example, when an In composition ratio is 0.51, a Ga composition ratio is 0.49.

When the channel layer 14 is formed of InGaP, it is preferable to form a semiconductor layer having a wider band gap and higher resistance than the InGaP layer below the InGaP layer. To obtain the above-described characteristics of InGaP it is preferable that channel current is confined in the InGaP layer. This is because it is effective to this end that a high-resistance layer is formed below the InGaP layer.

Here, for example, a case that the channel layer 14 of an InGaP layer is formed on the GaAs layer will be considered. Two dimensional electron gas is generated in the interface of the GaAs layer with the InGaP layer, and a channel current component flowing in the GaAs layer is generated. The characteristics of the GaAs layer are also exhibited in the I–V characteristics, which causes a risk that the characteristic of high voltage provided by InGaP may be degraded.

In view of this, in the present embodiment, the buffer layer 12 is formed of AlInP. AlInP has an about 2.4 eV band gap when an Al composition ratio is about 0.5. Accordingly it is possible to confine the channel current in the InGaP layer.

The buffer layer 12 may be formed of another semiconductor material as long as the material is able to be epitaxially grown on the GaAs substrate 10 and has a wider band gap than InGaP. Generally materials which are able to epitaxially grow on the GaAs substrate 10 have band gaps widened by addition of Al. Materials of InGaP and GaAs with Al added, e.g., AlInGaP and AlGaAs, can be used.

AlInGaP is not substantially influenced by an Al composition ratio and lattice-matches with GaAs when an In composition ratio is about 0.49. Accordingly, when the buffer layer 12 is formed of AlInGaP, an Al composition ratio+a Ga composition ratio is about 0.51, and when the Al composition ratio is above 0, the above-described effect can be obtained. The Ga composition ratio may be zero.

AlGaAs can have a band gap equal to or wider than that of InGaP when an Al composition ratio is more than about 0.2. Accordingly, in a case that the buffer layer 12 is formed of AlGaAs, an Al composition ratio is above about 0.2 to obtain the above-described effect.

On the other hand, it is preferred that the Schottky layer 16 covering the InGaP layer is formed of a semiconductor material which is able to epitaxially grow on the channel layer 14 and contains no In. This is because an In-content semiconductor material has an unstable interface with a metal material forming the gate electrode 34, and preferably an In-content semiconductor material is not exposed to the surface because In is oxidized to generate the conducting material.

In the present embodiment, the Schottky layer 16 is formed of an AlGaAs layer. An Al composition ratio of the AlGaAs layer may be any as long as the AlGaAs layer can be epitaxially grown on the channel layer 14. The Schottky layer 16 may be formed of a GaAs layer.

FIG. 2 is a graph of drain voltage dependence of power characteristic. A gate width of the field effect transistor used for the measurement is 200 μm. As shown, in the case of a GaAs FET including the channel layer 14 formed of a GaAs layer, the FET was broken at an about 20 V drain voltage. In the case of the present embodiment including the channel layer 14 of an InGaP layer, the FET was not broken at a 30 V drain voltage, and good power characteristic could be obtained.

When the channel layer 14 has an about $1.5 \times 10^{17}$ cm$^{-3}$ carrier concentration and a thickness of about 150 nm-, Gunn oscillation did not take place even with a gate-drain gap set at 4 μm, and a 60 V voltage resistance could be obtained. A 30 V operation could be ensured. In the semiconductor device having a 50 mm gate width, an about 50 W high-power output could be obtained.

On the other hand, in the case that the channel layer is formed of a GaAs layer of the above-described carrier concentration and thickness, Gunn oscillation took place at a gate-drain gap of above about 2 μm, and the operation became unstable. Thus, a voltage resistance was about 20 V, and about 10 V was operational threshold in terms of reliability. In the semiconductor device having a 50 mm-gate width, an about 15 W power output was a limit.

The semiconductor device including the channel layer of InGaP can have much improved characteristics than the conventional semiconductor device.

In a station of a mobile communication system, the operation at 10–20 W is normally required, and when calls coincide, about 100 W output must be supplied. According to the present embodiment, an about 50 W output can be obtained at a 50 mm-gate width, and about 100 W outputs can be easily obtained by a single FET. This can simplify the system.

The field effect transistor having an 100 mm-gate width can be laid easily in an about 1×3 mm area, which is the limit of the chip size in terms of handling.

Next, the method for fabricating the semiconductor device according to the present embodiment will be explained with reference to FIGS. 3A–3C and 4A–4C.

Figure 3A:
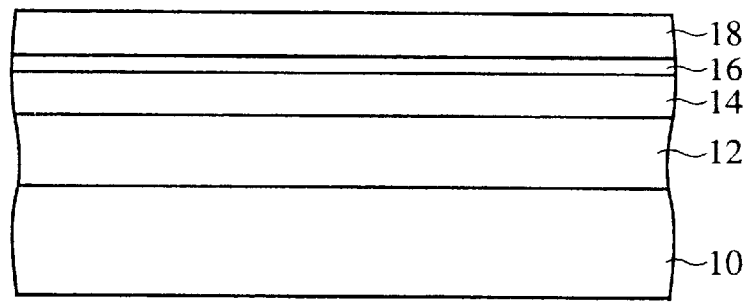
FIGS. 3A–3C are sectional views of the semiconductor device according to the embodiment of the present invention at the steps of the method for fabricating the same, which shows the method (Part 1).

First, on the GaAs substrate 10 the buffer layer 12 of an AlInP layer, the channel layer 14 of an InGaP layer, the Schottky layer 16 of an AlGaAs layer and the cap layer 18 of a GaAs layer are continuously formed (FIG. 3A). The layer except the channel layer 14 are non-doped layers. The channel layer 14 has, e.g., an about $1.5 \times 10^{17}$ cm$^{-3}$ carrier concentration and a thickness of about 150 nm-. The Schottky layer 16 has, e.g., a thickness of about 30 nm-. The cap layer has, e.g., a thickness of about 100 nm-.

Then, a photo resist 20 is formed on the cap layer 18, covering a region to be a device region.

Figure 3B:
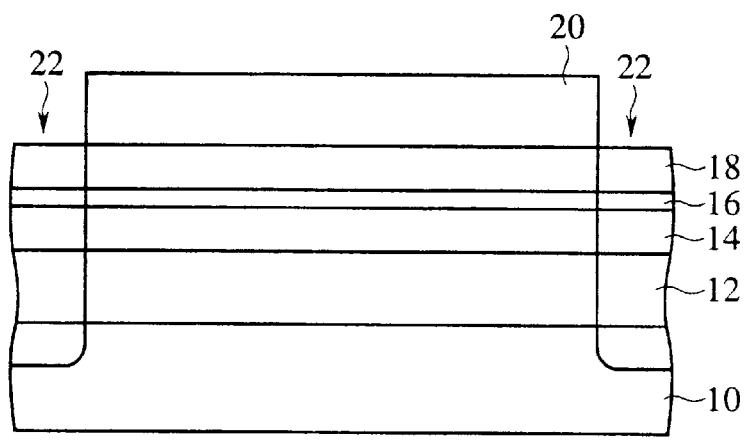

Subsequently, oxygen ions are implanted with the photoresist 20 as a mask to inactivate the region where the photoresist 20 is not formed. The inactivated region is to be a device isolation region 22 (FIG. 3B).

Then, a photoresist 24 having openings in regions to be the source/drain regions is formed on the cap layer 18.

Then, with the photoresist 24 as a mask Si ions are implanted. For example, an acceleration energy is 50 keV, and a dose is $1 \times 10^{13}$ cm$^{-2}$.

Figure 3C:
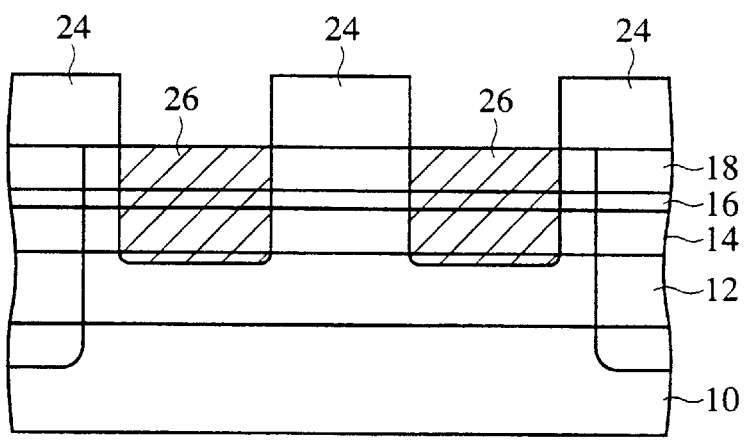

After the photoresist 24 is removed, a thermal treatment is conducted at 650° C. for 20 minutes to activate the implanted Si ions, and the ohmic regions 26 are formed (FIG. 3C).

Figure 4A:
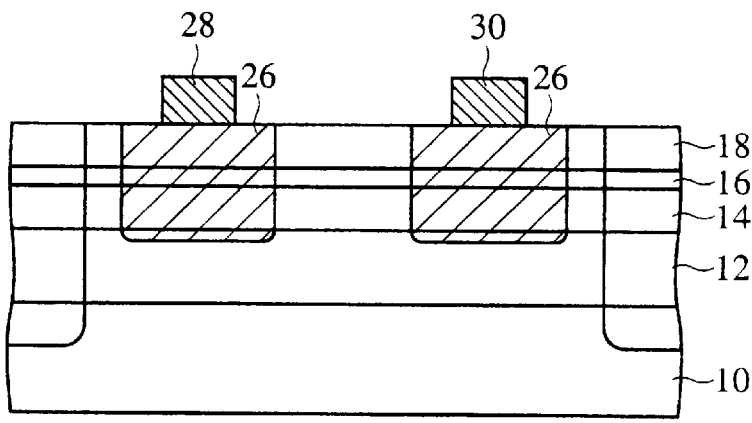
FIGS. 4A–4C are sectional views of the semiconductor device according to the embodiment of the present invention at the steps of the method for fabricating the same, which show the method (Part 2).

Subsequently, the source electrode 28 and the drain electrode 30 are formed by lift-off on the cap layer 18 with the ohmic region 26 formed on (FIG. 4A). The source electrode 28 and the drain electrode 30 are formed of a laminated film of, e.g., an about 30 nm-thick AuGe film and an about 300 nm-thick Au film.

Then, a photoresist 32 having an opening in a region for the gate electrode to be formed is formed.

Figure 4B:
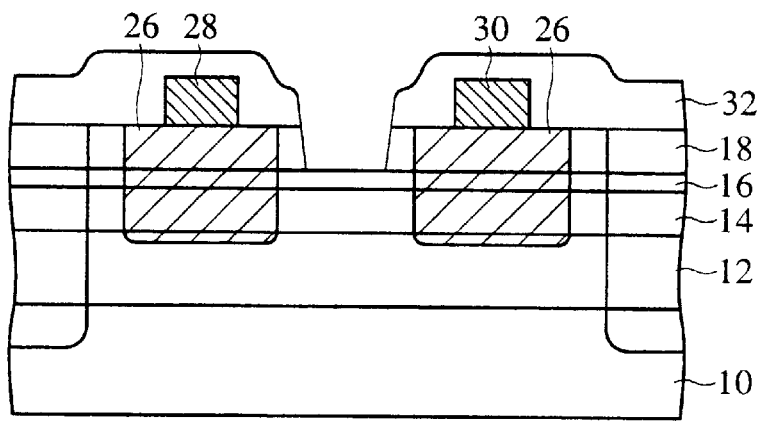

Then, the cap layer 18 is etched with the photoresist 32 as a mask to expose the Schottky layer 16 between the source electrode 28 and the drain electrode 30 (FIG. 4B).

Figure 4C:
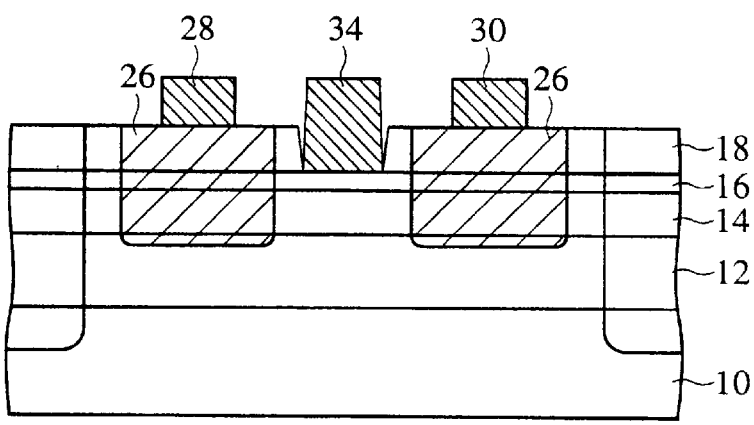

Subsequently, an about 400 nm-thick Al film is deposited by vacuum evaporation method, and the gate electrode 34 connected to the Schottky layer 16 is formed by lift-off (FIG. 4C).

Thus, the field effect transistor including the channel layer of an InGaP layer is fabricated.

As described above, according to the present embodiment, the field effect transistor including the channel layer 14 of an InGaP layer is fabricated, whereby the semiconductor device can operate at high speed and high voltage.

The present invention is not limited to the above-described embodiment and covers various modifications.

For example, in the above-described embodiment the cap layer 18 is formed on the Schottky layer 16, but the cap layer 18 is not essential.

As long as the oxidation of the surface of the channel layer 14 of an IngaP layer can be prevented by other technique, the Schottky layer 16 is not essential.

What is claimed is:

1. A semiconductor device comprising:

a GaAs substrate;

a buffer layer formed on the GaAs substrate and formed of a semiconductor material having a wider band gap than InGaP;

a channel layer formed of an InGaP formed on the buffer layer; and a gate electrode for controlling current of the channel layer.

2. A semiconductor device according to claim 1, wherein an In composition ratio of the InGaP forming the channel layer is not less than 0.3 and not more than 0.7.

3. A semiconductor device according to claim 2, wherein the buffer layer is formed of an AlInGaP.

4. A semiconductor device according to claim 3, wherein an Al composition ratio of the AlInGaP is more than 0, and a sum of the Al composition ratio and a Ga composition ratio is substantially equal to 0.51.

5. A semiconductor device according to claim 2, wherein the buffer layer is formed of an AlGaAs.

6. A semiconductor device according to claim 4, wherein an Al composition ratio of the AlGaAs layer is not less than 0.2.

7. A semiconductor device according to claim 1, further comprising:

a Schottky layer formed on the channel layer and formed of a semiconductor material containing no In.

8. A semiconductor device according to claim 2, further comprising:

a Schottky layer formed on the channel layer and formed of a semiconductor material containing no In.

9. A semiconductor device according to claim 3, further comprising:

a Schottky layer formed on the channel layer and formed of a semiconductor material containing no In.

10. A semiconductor device according to claim 5, further comprising:

a Schottky layer formed on the channel layer and formed of a semiconductor material containing no In.

11. A semiconductor device according to claim 7, wherein the Schottky layer is formed of a GaAs or an AlGaAs.

* * * * *